United States Patent [19]

Carr

[11] Patent Number: 5,627,846
[45] Date of Patent: May 6, 1997

[54] DROP-OUT LOCATION DETECTION CIRCUIT

[75] Inventor: Thomas D. Carr, Leucadia, Calif.

[73] Assignee: Eastman Kodak Company, Rochester, N.Y.

[21] Appl. No.: 424,916

[22] Filed: Apr. 19, 1995

[51] Int. Cl.$^6$ ............................................. H01S 3/03
[52] U.S. Cl. ........................ 371/65; 371/57.1; 375/224; 375/239; 360/46
[58] Field of Search ........................ 371/65, 57.1, 57.2, 371/61, 62, 42, 46, 47.1, 48; 341/183, 111, 127, 132, 143; 327/18, 30, 37, 47; 360/38.1, 13, 42, 46, 53; 375/340, 224, 226, 239, 241, 242; 358/336; 340/146.2

[56] References Cited

U.S. PATENT DOCUMENTS

| | | | |
|---|---|---|---|
| Re. 33,665 | 8/1991 | Ogawa | 369/33 |
| 3,629,823 | 12/1971 | Cseralkowski | 340/146.1 |
| 3,715,738 | 2/1973 | Kleist et al. | 360/13 |
| 3,840,892 | 10/1974 | Hayashi | 360/53 |
| 4,025,917 | 5/1977 | DuBrul | 340/347 DD |
| 4,353,130 | 10/1982 | Carasso et al. | 375/114 |
| 4,449,222 | 5/1984 | Crossett, III et al. | 375/10 |
| 4,603,357 | 7/1986 | Ramirez et al. | 360/46 |
| 4,613,769 | 9/1986 | Gross et al. | 307/351 |
| 4,964,139 | 10/1990 | Wash et al. | 375/23 |
| 4,977,419 | 12/1990 | Wash et al. | 354/76 |
| 5,020,057 | 5/1991 | Taniguchi et al. | 370/102 |
| 5,089,821 | 2/1992 | Mori | 341/155 |
| 5,105,316 | 4/1992 | Cronch | 360/46 |
| 5,111,485 | 5/1992 | Serack | 375/112 |
| 5,136,591 | 8/1992 | Krause | 371/20.4 |
| 5,148,291 | 9/1992 | Kimura et al. | 358/336 |
| 5,199,007 | 3/1993 | Okano | 371/62 |
| 5,293,369 | 3/1994 | Melas et al. | 369/59 |
| 5,301,207 | 4/1994 | Emerson et al. | 375/10 |
| 5,313,236 | 5/1994 | Izukawa | 354/106 |
| 5,345,216 | 9/1994 | Chopra et al. | 340/146.2 |
| 5,455,720 | 10/1995 | Norton | 360/46 |

*Primary Examiner*—Robert W. Beausoliel, Jr.
*Assistant Examiner*—Phung My Chung
*Attorney, Agent, or Firm*—William F. Noval

[57] ABSTRACT

A digital data reproducing circuit for use with a magnetic or optical data storage for detecting and flagging signal level drop-outs in pulse position modulated (PPM) recorded signal levels. Positive and negative peak amplitudes of a self-clocking PPM coded signal are compared to positive and negative valid information peak detectors to detect the clock and PPM data. Lower peak (in absolute terms) amplitudes that fall from the normal signal levels at the start of a drop-out and/or rise at the end of the drop-out, are detected by positive and negative drop-out peak detectors. The positive and negative drop-out peak detectors are inhibited when valid clock and data peak pulses are detected.

16 Claims, 8 Drawing Sheets

DROP-OUT LOCATION DETECTION CIRCUIT

CROSS-REFERENCE TO RELATED APPLICATION

Reference is hereby made to commonly assigned, U.S. patent application Ser. Nos.: (Docket 70203) 08/424,913 filed, Apr. 4, 1995, in the name of Thomas D. Carr and entitled PPM DECODING SYSTEM UTILIZING DROP-OUT INFORMATION.

FIELD OF THE INVENTION

This invention relates to electrical circuits suitable for decoding binary information from analog signal and clock patterns read out of a storage media, and particularly to such circuits for locating drop-outs in the recorded analog signal patterns.

BACKGROUND OF THE INVENTION

Magnetic recording stores information in a hard magnetic layer of a magnetic medium by setting the direction of magnetization of regions of the layer. A recording apparatus of the type using a magnetic disk, magnetic tape or similar magnetic recording medium, reproduces stored digital data in the form of an analog waveform representative of transitions of magnetic polarity on the recording medium. In the case of data recorded in an NRZ (non-return to zero) or NRZI (non-return to zero inverted) recording pattern, for example, positive and negative peaks follow one another in succession with transitions between the peaks passing through the signal baseline. Depending on the code useca, the positive and negative peaks may represent explicit data bit values, in self-clocking codes, or may represent explicit clock bits and encoded data bits in pulse position or interval modulation codes. One form of a digital data reproducing circuit for reading any such recorded code differentiates the reproduced waveform and determines the points where the differentiated waveform crosses a zero level representative of zero AC volts, to detect the peaks.

In commonly assigned U.S. Pat. No. 4,977,419, to Wash et al., a photographic filmstrip having a virtually transparent, magnetic film layer covering the non-emulsion side of the filmstrip (referred to as an MOF layer) is disclosed in conjunction with various camera systems. Potential longitudinal recording tracks are illustrated in the MOF layer in both the image frame area and on either side of the image frame area for recording information such as film type, film speed, film exposure information and information relevant to the processing and subsequent use (e.g., printing) of the exposed image frames. The systems disclosed therein provide for recording of information during film manufacture, reading and/or recording of information on certain tracks during camera use, and reading and/or recording of printer related information during photofinishing.

Novel methods for modulating the binary data or information into a format suitable for recording and reproducing in such tracks in the camera shown in the '419 patent are disclosed in commonly assigned U.S. Pat. No. 4,964,139, also to Wash et al. Two self synchronizing PPM coding methods are disclosed in the '139 patent, as the "Wash encoded signal" and the "Chi encoded signal" methods. Both PPM encoding methods have similarities as pointed out in the '139 patent, and the Wash encoded signal method is further referred to herein for purposes of explaining how the present invention may be practiced in at least one of its preferred embodiments in locating drop-outs in magnetically recorded data encoded in such a manner.

An example of the Wash encoding method, as used to record data in bit streams in the MOF layer tracks described in the '419 patent, is shown in FIG. 1 which essentially reproduces FIG. 3 of the '139 patent. In FIG. 1A), two successive bits 0 and 1 are position encoded in the two corresponding "interval or information-cells" as positive going data signal level transitions bounded by negative going clock signal transitions between the directions of magnetization. The Wash self-clocking bit code is effected by the position of the positive going data signal level transition in the information-cell. If it is positioned within the first half of the duration of the information-cell, then a data bit 0 is recorded. Similarly, a data bit 1 is recorded by positioning the data transition in the second half of the information-cell. As an aside, it should be noted that the data bit may in fact be a parity bit, as the two terms are used below.

Note that the encoding of the information or data transitions for both the first and second information-cells leaves invariant the clock transitions. With this self-clocking code, film transport velocity can vary during recording and playback without affecting the ability to synchronize and read the recorded data. As a result, the information-cells may lengthen or shorten depending on the filmstrip velocity, but the relative position of the data transitions can still be decoded. Thus, the camera disclosed in the '419 patent, for example, may record data in the MOF layer tracks while winding the filmstrip between exposures without imposing any velocity controls or recording an independent clock track. In fact, large amounts of jitter in the camera transport at frequencies at or near the data frequencies precludes the use of a phase-locked loop in generating a clock during magnetic signal read out.

The PPM information-cells are decoded by means of a head sensitive to the field or rate of change of the flux emanating from the polarized regions at the transition zones. The signal produced by most magnetic reproduce heads is a voltage pulse corresponding to the location of a transition zone from one magnetically set region to another. The detection circuitry to which the head is attached must determine the location of one peak relative to another. This is most often done by differentiating the pulse and comparing the voltage to zero. The differentiated waveform will cross zero at a time corresponding to the peak in the original waveform, at which point the comparator will change state. This works well in the region where the pulse has energy. However, outside this region, the input: to the comparator hovers around zero, crossing zero as a result of noise, producing transitions at the output. To remedy this, the output of the comparator is gated by a circuit which only allows the comparator state to change when the input waveform exceeds a threshold, usually 30%–45% of the peak amplitude. This scheme works well in eliminating the unwanted transitions. A side effect is that, if the peak amplitude of the input signal fails to reach the threshold, no transition will occur and the data will be missed. Hard disk drives deal with this problem by marking locations on the disk where this occurs and not using the areas. Tape drives use frequent re-synching, read-while-write, re-reading, and powerful error correction code (ECC) to deal with the problem. Simple, inexpensive systems for use in cameras cannot use such complex and expensive solutions, and resort is therefor made to the self clocking PPM coding of Wash or Chi.

As shown in FIG. 1B, the data and clock transitions are read out as positive and negative going spike signals at the transitions. Turning to the read circuit 10 of FIG. 2, reproduced from the '139 patent, a read/write magnetic head 12 provides the read signals of FIG. 1B on lines 14. A preamplifier 16 amplifies the output signal from the magnetic head 12 and applies the amplified signal on lines 26 to a filter 18 for removing an unnecessary component from the amplified read signals. A post-amplifier 20 amplifies the filtered read signals and applies the filtered and amplified, positive and negative, signals to a detector 24 via line 22. In detector 24, the signals are applied to a positive peak detector (NPD) 30 and a negative peak detector (PPD) 32 for detecting the negative and positive pulses having amplitudes exceeding respective threshold levels to ensure that noise signals are not decoded as data or clock signals. Uniform amplitude, polarity, and pulse width, clock and data, signal pulse trains are thereby generated on lines 38 and 34 as depicted in FIG. 1C. A delay circuit 40 is connected to the NPD 32 via line 38, resulting in a delayed clock pulse train on lines 46 and 48 and also appearing in FIG. 1C.

The delayed clock signal is applied to the set terminal of the flip-flop 36 and is also applied to clear the up/down counter 50. The data signal is applied to the clear terminal of the flip-flop 36, so that the flip-flop 36 is set by delayed clock signals and cleared by data signals to provide the square wave signal shown in FIG. 1D at the Q output. The Q output is set high by a delayed clock signal and low by the succeeding data signal.

During the high state, the up/down counter 50 counts system clock 56 pulses applied to its CLK input, incrementing the count when the Q out, put is high and decrementing the count when the Q output is low. The most significant bit (MSB) of the output count of the up/down counter 50 and the CLOCK output from the NPD 32 are supplied to a computer 42. The particular manner of determining the data bit in the information-cell is further explained in the '139 patent.

Because of the pulse position modulation, variation in velocity of the filmstrip during recording or readout (within reasonable bounds in which a camera would be specified to operate) does not effect the accuracy of the data, as described above. However, the compliance of the magnetic record/ reproduce head with the low density MOF layer during recording or reproducing the recorded data itself may be faulty for other reasons leading to a failure to either read or write data in one or more of the information-cells.

When compliance with the magnetic head is lost due to a dirt speck on the magnetic medium or curl of the medium or jitter in the head suspension or if the magnetic recording medium has a defect such as a change in the density of the magnetic powder or if electrical noise is introduced in a playback system from outside the system, false data generally referred to as a "drop-in" and/or the omission of data generally referred to as a "drop-out" can occur in the reproduced data stream. As described above with respect to FIG. 2, the conventional data read out circuit compares the absolute positive and negative amplitudes of the reproduced analog waveforms to threshold levels in the PPD and NPD circuits to convert, among the above-mentioned peaks, only the peaks having amplitudes higher than a predetermined threshold level into digital signals, determining that they are data bits 1 or 0 depending on their position in the case of the PPM encoded signals. Thus, if the amplitudes of the pulse signals fade below the thresholds, both the clock pulses separating successive information-cells and the data pulses signifying the binary data content can be lost.

The information-cells are recorded in a pattern of multibit bytes described in detail in the '419 patent, particularly in regard to FIGS. 6–9 thereof. A simplification of that format appears as follows in Table I:

| Original Data | | | | | | | |
|---|---|---|---|---|---|---|---|
| $P_1$ | $d_{11}$ | $d_{12}$ | $d_{13}$ | $d_{14}$ | $d_{15}$ | $d_{16}$ | $d_{17}$ |
| $P_2$ | $d_{21}$ | $d_{22}$ | $d_{23}$ | $d_{24}$ | $d_{25}$ | $d_{26}$ | $d_{27}$ |
| $P_3$ | $d_{31}$ | $d_{32}$ | $d_{33}$ | $d_{34}$ | $d_{35}$ | $d_{36}$ | $d_{37}$ |
| P | P | P | P | P | P | P | P |

A block of three data bytes of eight information-cells is shown. The first bit of each byte is a parity bit ($P_j$), and the remaining seven bits are data bits ($d_{i1}$–$d_{i7}$). Each block of bytes recorded serially in a single track in the MOF layer is separated by a parity byte, called a Longitudinal Redundancy Check (LRC). Each vertical column bit value of the LRC is calculated from the values of the data bits in its respective column. The data bits of successive information-cells in each block are thereby protected with a 2-dimensional, horizontal and vertical, parity check in the data blocks. This scheme is able to correct an odd number of bits in error in any one byte, provided a bit is present at every position and the LRC is present in its proper position with the longitudinal parity bits lined up with their respective columns.

The PPM encoding method described above incorporates the clock information in with the data so that a drop-out typically results in both loss of data content and loss of the clock signal. When a drop-out occurs, no clock is available to transmit data from the decoder to the memory, so that bits are completely missing in the recovered data block. This results in loss of byte synchronization and renders the parity checks useless in recovering the uncorrupted data. Shown below in Table II is the situation after recovery when bits are lost:

| Corrupted Data | | | | | | | |
|---|---|---|---|---|---|---|---|
| $P_1$ | $d_{11}$ | $d_{12}$ | $d_{13}$ | $d_{14}$ | $d_{15}$ | $d_{16}$ | $d_{17}$ |
| $P_2$ | $d_{21}$ | $d_{22}$ | $d_{23}$ | $d_{27}$ | $P_3$ | $d_{31}$ | $d_{32}$ |
| $d_{33}$ | $d_{34}$ | $d_{35}$ | $d_{36}$ | $d_{37}$ | P | P | P |
| P | P | P | P | P | X | X | X |

A drop-out of three information-cells and the respective data bits $d_{24}$, $d_{25}$, $d_{26}$, occurred in the second row, causing the data bytes and the LRC parity bits to shift in the recovered block. No correction is possible because of this, and the data read out may either be thwarted or the data may be misinterpreted. It should be understood that in practice, the problem is magnified by the number of bytes in the data set and the location of the drop-out in the series of bytes.

SUMMARY OF THE INVENTION

It is therefore an object of the present invention to provide a system for flagging the occurrence and the position of a drop-out in a data bit stream of a data block.

These and other objects of the invention are realized in a method of and apparatus for locating drop-outs in the read out peak signal patterns of encoded data comprising the steps of and means for: providing a first threshold for decoding a peak of the read out signal pattern as a valid peak; providing a second threshold lower in absolute magnitude than the first threshold indicative of a drop-out in the recorded signal pattern magnitude; comparing the read out signal pattern to the first and second thresholds; decoding a valid peak detect pulse when a predetermined relationship between the magnitude of the read out signal pattern and the first threshold exists; and decoding a drop-out pulse when a predetermined relationship between the magnitude of the read out signal pattern and the second threshold exists.

The method and apparatus preferably further comprises the step of and means for inhibiting the decoding of the drop-out pulse when the predetermined relationship between the magnitude of the read out signal pattern and the first threshold exists. In this regard, the peaks of the read out signal pattern are detected to provide a timing pulse in response thereto, and the inhibiting step or means operates to negate the decoding of the drop-out pulse in response to the timing pulse and the decoding of the valid peak detect pulse.

The invention is preferably practiced with a NRZ or NRZI Wash et al. code as described above or other codes wherein the encoded data comprises magnetically recorded signal patterns having successive positive and negative peaks signifying information content by relative position of the peaks. In decoding such encoded signal patterns, positive and negative peak detect and drop-out thresholds are provided or employed for deriving both the positive and negative peak detect pulses and drop-out pulses.

ADVANTAGES OF THE INVENTION

The present invention describes a peak detector circuit which may provide an indication as to when a drop-out begins and ends. When used by the block decoder, this information allows systems to recover lost information with simple ECC codes or redundant recording of the data. The identification of the beginning and/or end of a drop-out ensures that the data is not misinterpreted and employed incorrectly, e.g. in processing a filmstrip having such encoded data recorded in the MOF layer tracks, for example. In a typical clocked code, the number of missing bits can be determined. Once the number of bits are determined, the location in the stream of bytes can be determined.

BRIEF DESCRIPTION OF THE DRAWINGS

Other objects, advantages and features of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 2:
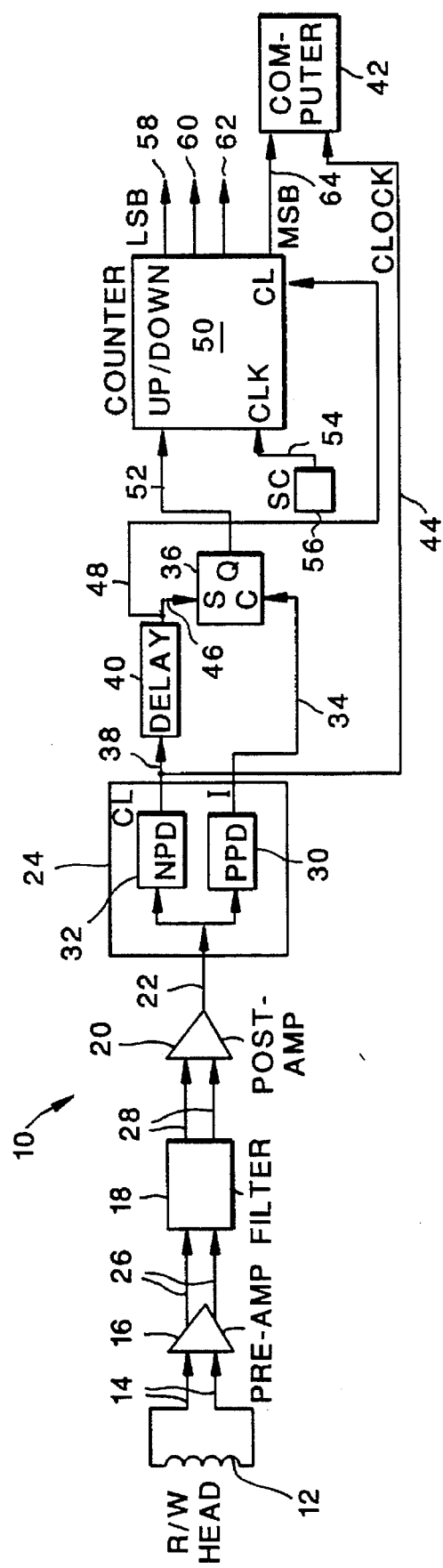
FIG. 2 depicts shows the prior art decoding circuit for decoding data and parity bits in information-cells in blocks of recorded data and parity bytes.

The present invention may be implemented into a system for decoding the Wash self clocking PPM signal levels in a read out circuit similar to that of FIG. 2 with modifications made to the peak detector 24 and incorporation of the operations of flip-flop 36, delay 40 and counter 50 into a microprocessor-based microcomputer. Turning now to FIGS. 3 and 4, the modified peak detector 64 includes a first PPD and NPD which detect peak signal levels that exceed (in absolute terms) the data and clock thresholds for decoding data and clock pulses and a second PPD and NPD which detect peak signal levels that exceed (in absolute terms) a lower threshold pair for detecting sub-threshold data and clock pulses occurring as the signal level drops out.

Figure 1:
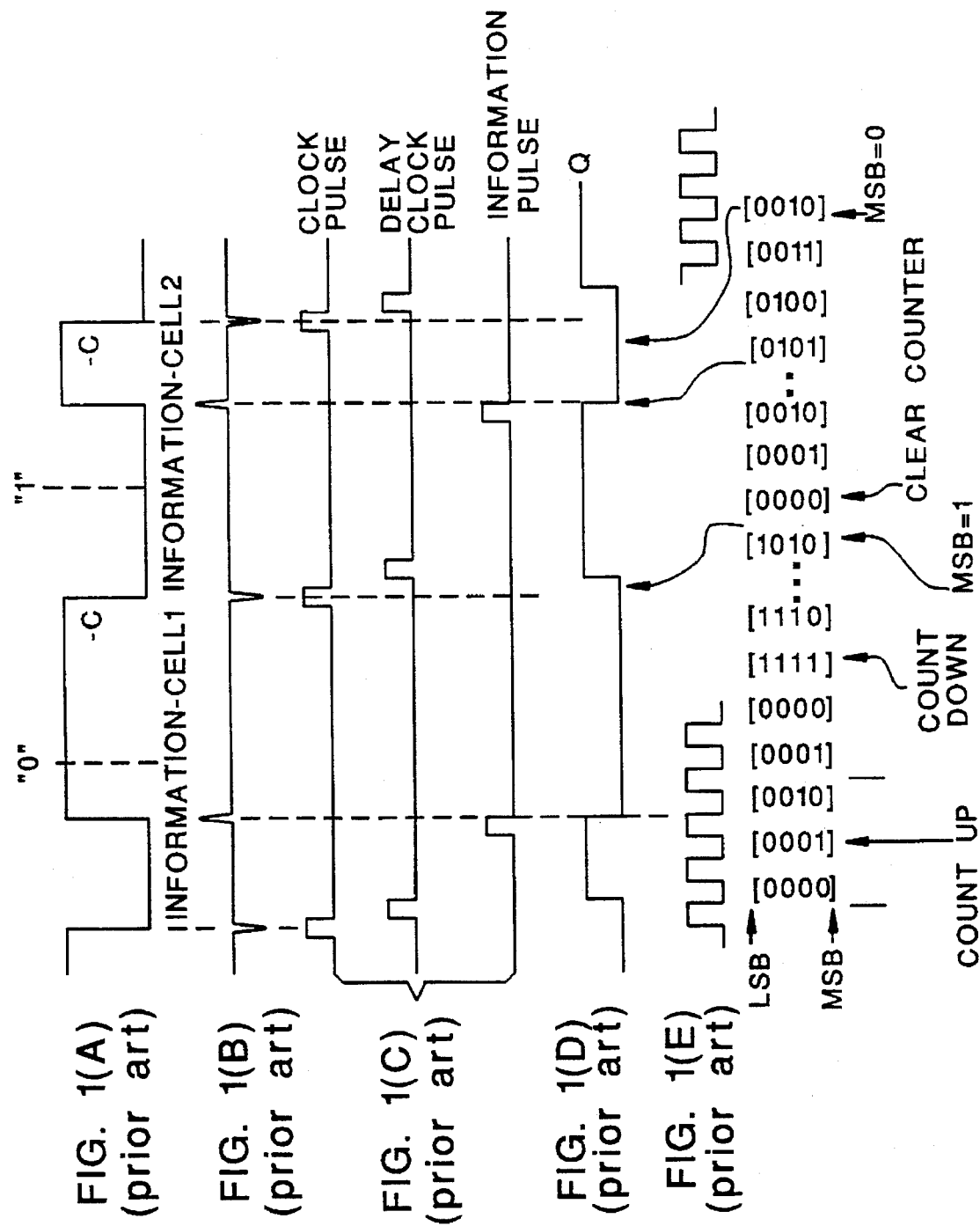
FIGS. 1A–1E are waveform diagrams showing the recorded PPM information-cell clock and data signals of the prior art and the decoding of the data signals therefrom with the circuit of FIG. 2.
Figure 3A:
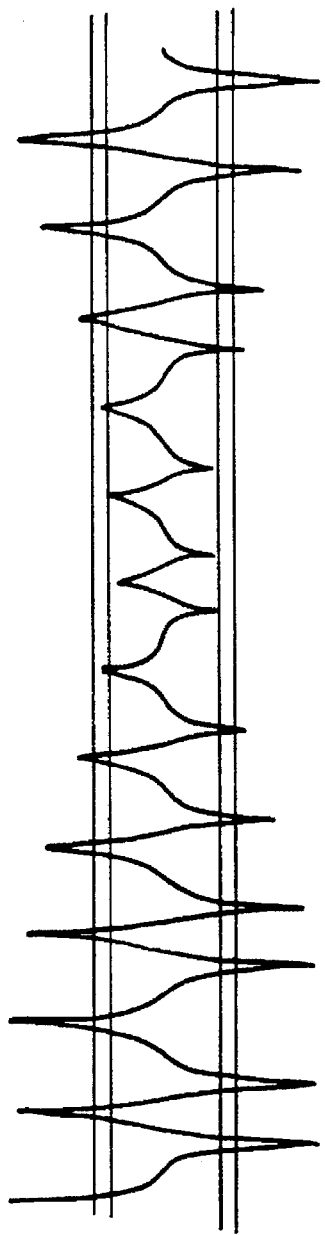
FIG. 3A–3F are waveform diagrams showing the decoding of recorded PPM information-cell clock and data signals and the identification of a drop-out and recover position in the decoded clock and data bit stream of any given block of bytes.
Figure 3B:
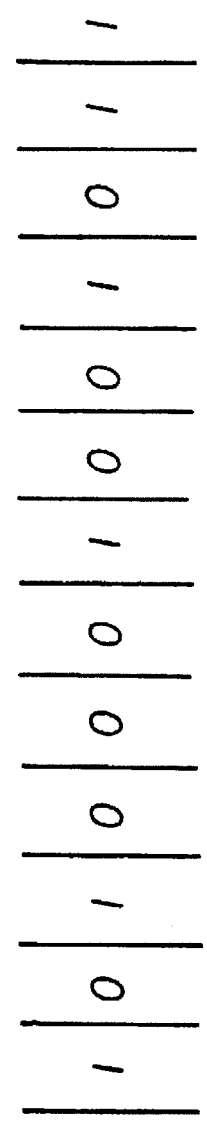
Figure 3C:
Figure 4:
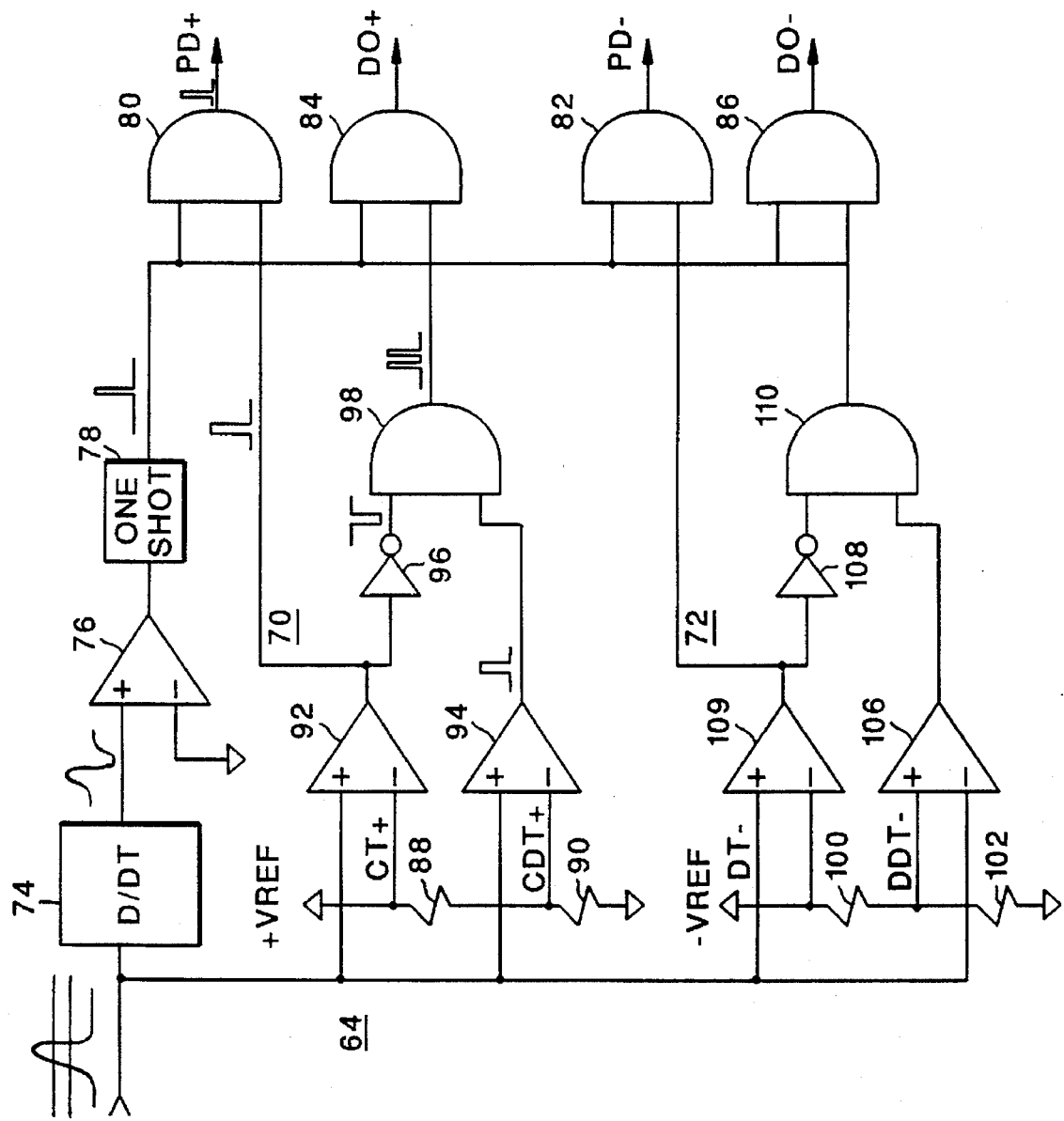
FIG. 4 is a modified peak detector in accordance with the present invention for detecting drop-outs and recovery in information-cells of FIG. 3A.
Figure 5:
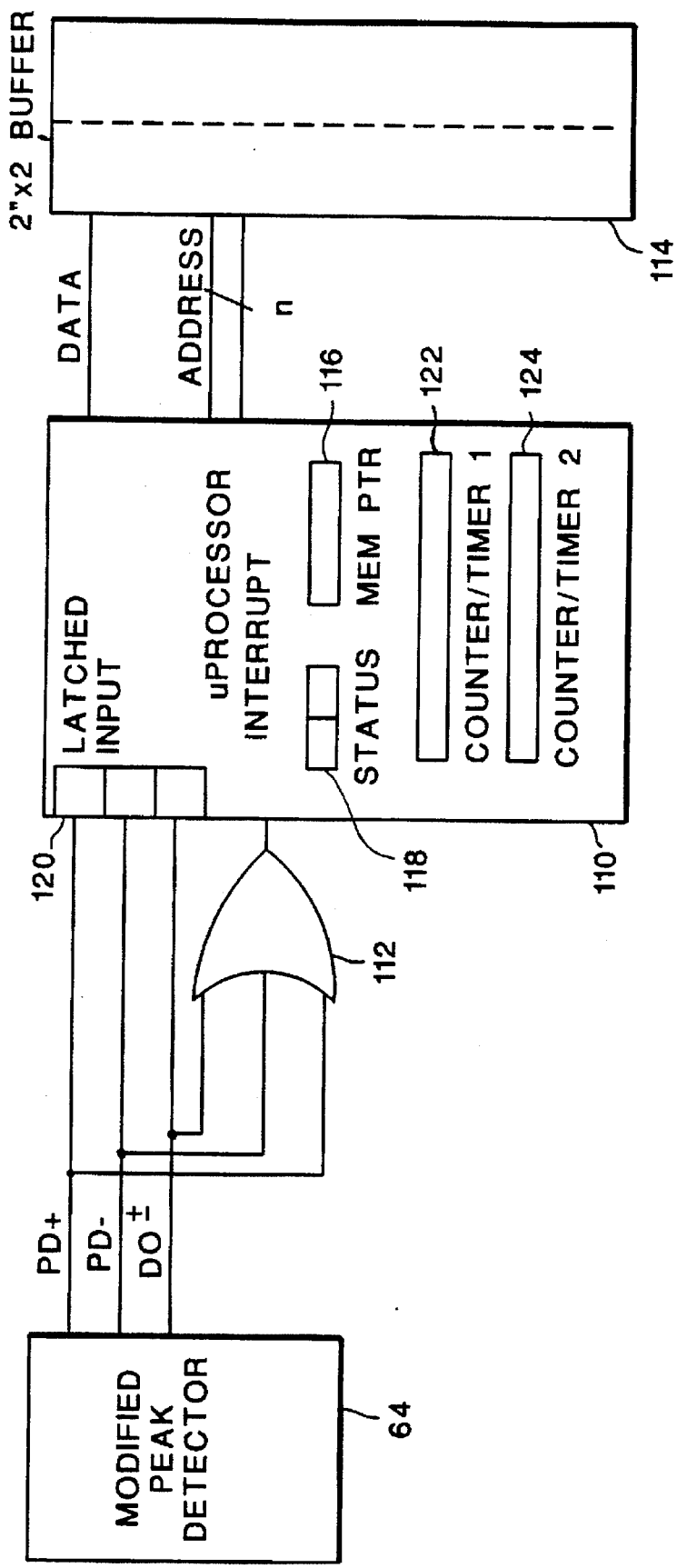
Figure 6:
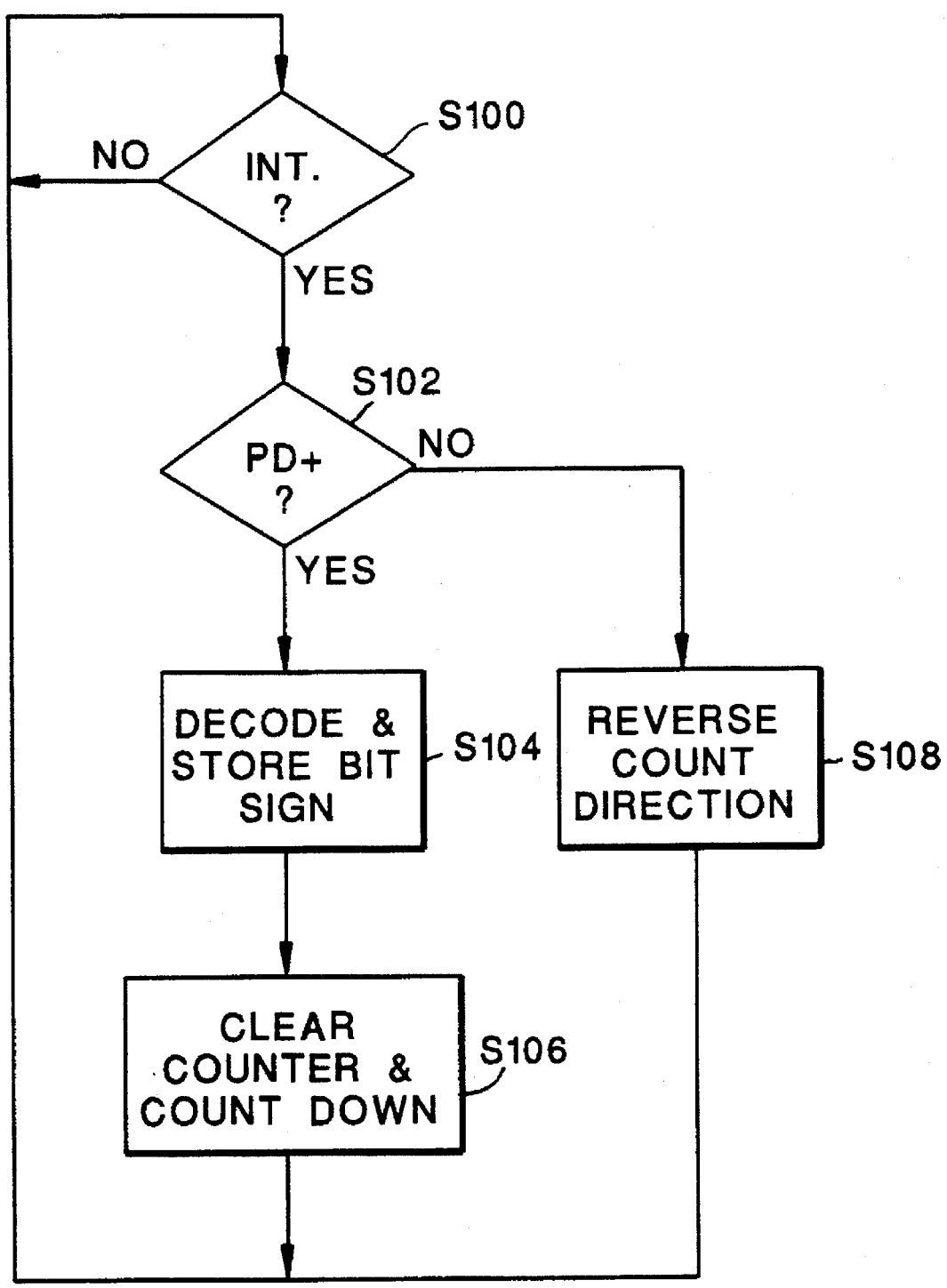
Figure 7:
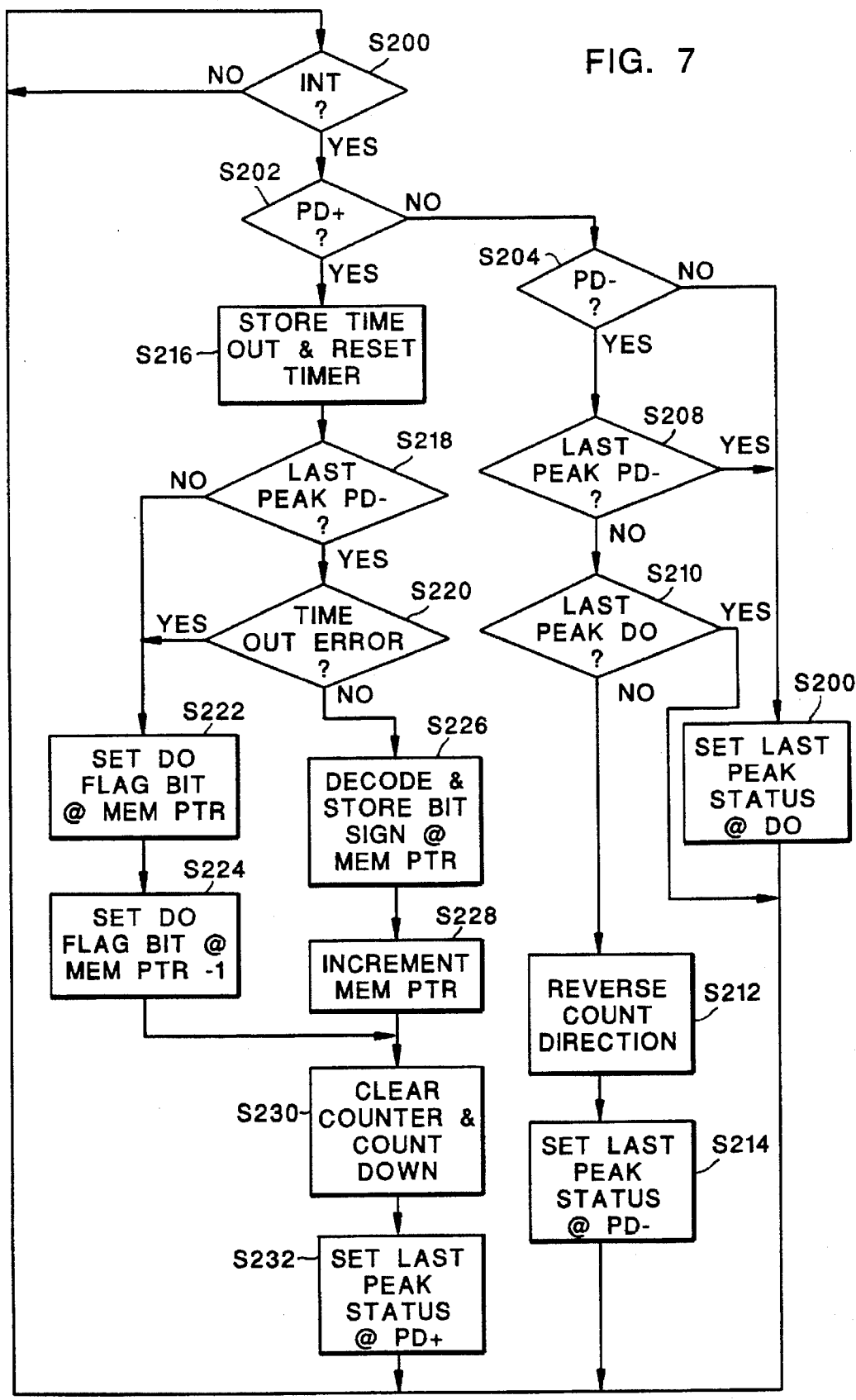
Figure 9:
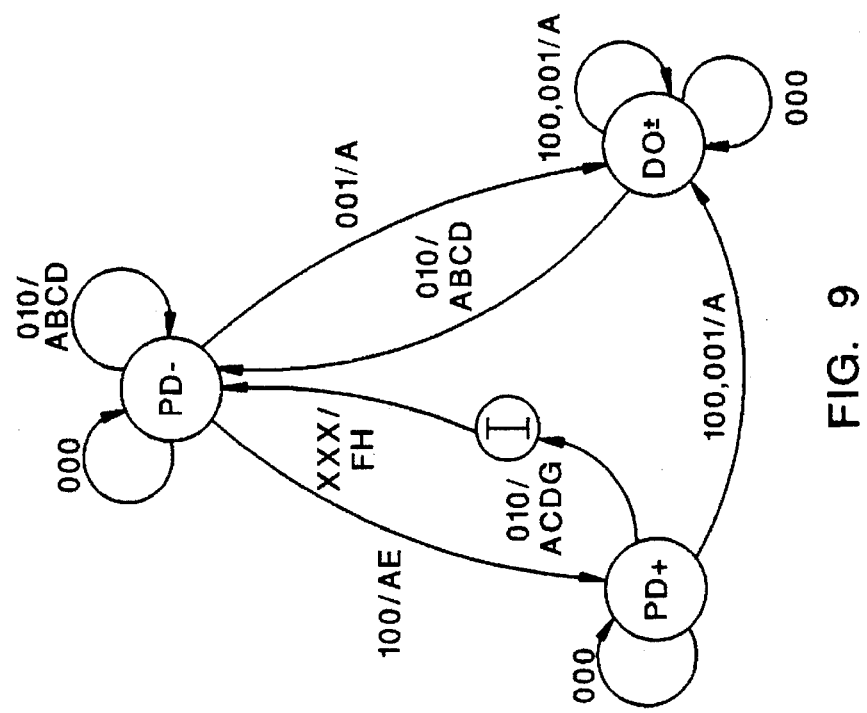
Figure 8:
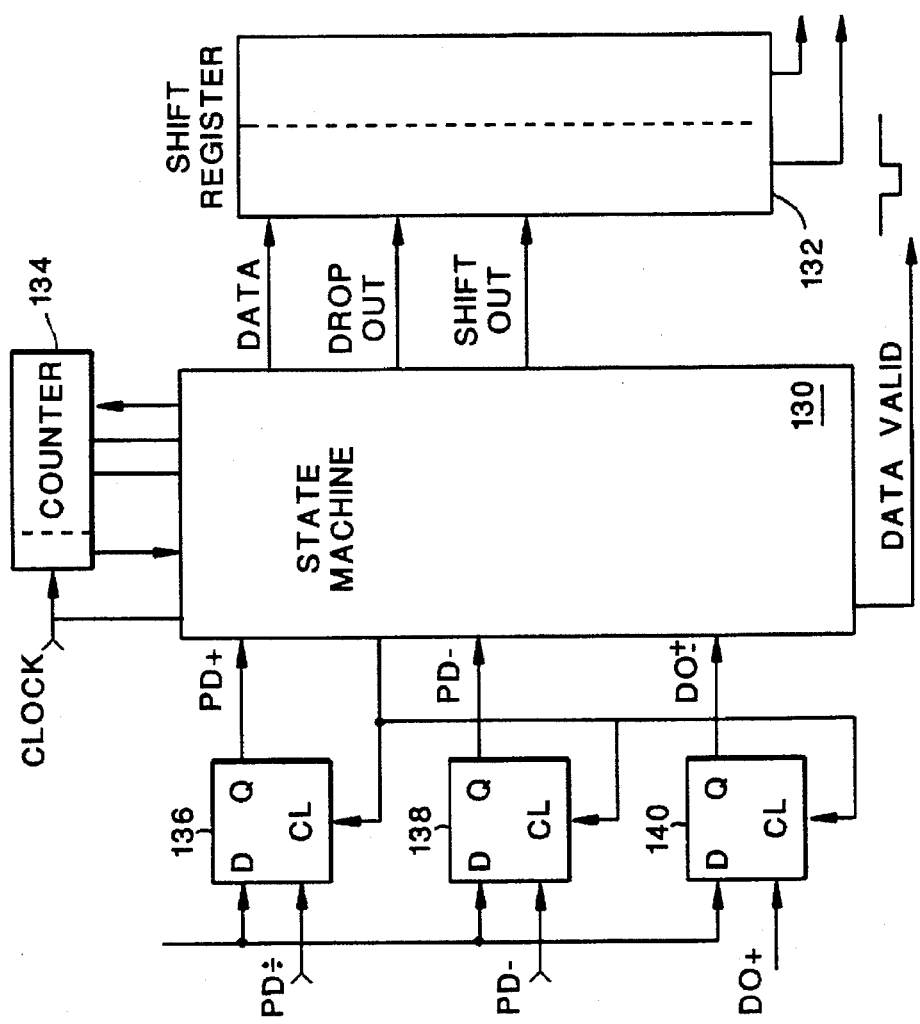

As shown in FIG. 3A, the pulse signal waveform is inverted from those shown in FIG. 1B, but may be assumed to be equivalent thereto in function and with reversal of designations of the output signals of the PPDs and NPDs. The PPM encoded data bit pattern is identified in FIG. 3B. A drop-out region is evidenced by the loss of amplitude of the pulse peaks.

Figure 3D:
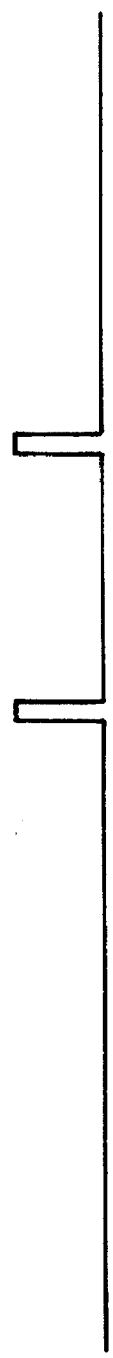

As also shown in FIG. 3A, the positive clock pulse threshold CT+ is augmented by a lower amplitude, positive clock drop-out pulse threshold CDT+. Similarly, the negative data pulse threshold DT– is augmented by a higher amplitude, negative data drop-out pulse threshold DDT–. Any pulse peaks of the PPM signal falling in the positive or negative threshold ranges between the two thresholds CT+ and CDT+ or DDT– and DT– provides drop-out pulses DO+ or DO–, respectively, marking those peaks as bounding a drop-out region (as shown in FIG. 3D for DO+). Positive (clock) and negative (data) pulse peaks exceeding both thresholds are indicated by trains of peak pulses PD+ and PD– appearing in FIGS. 3C and 3E. In this example, the negative data pulse peaks in the drop-out zone all fall below (in absolute terms) the data drop-out pulse threshold DDT–, and so none appear in FIG. 3F.

The four thresholds are set in the modified peak detector 64 of FIG. 4 by the reference voltages applied to input terminals of the modified PPD 70 and the modified NPD 72 which both receive the signal of FIG. 3A. Differentiator 74, comparator 76, and bi-directional one-shot 78 form a modified peak detector 64 that outputs a timing pulse for each peak in the incoming signal waveform, regardless of polarity and amplitude. It will be understood that differentiator 74 may be replaced by an integrator or a non-linear peak detector of types known in the art having good signal-to-noise discrimination. The incoming signal waveform is applied to positive input terminals of comparators 92 and 94 of the modified PPD 70 and to the negative input terminals of comparators 104 and 106 of the modified NPD 72. The modified PPD 70 and NPD 72 develop the pulse trains PD+ and PD– appearing in FIGS. 3C and 3E at the outputs of AND gates 80 and 82 or the pulse trains DO– and DO+ at the outputs of AND gates 84 and 86, except when the positive and negative signal peaks fall below both thresholds. Given the rise and fall times of the incoming waveform of the positive and negative peaks, it can be expected that the output signals from comparators 94 and 106 will be wider and encompass the duration of the output signals from comparators 92 and 104. The differentiator 74, comparator 76 and one shot 78 are set to output the timing pulse near the positive or negative pulse signal peak such that the timing pulse duration falls within the duration of the output signals from comparators 92 and 104.

First and second positive thresholds are set by the resistor pair 88 and 90 between +Vref and system ground. The positive pulse threshold voltages CT+ and CDT+ developed thereby are applied to the negative input terminals of comparators 92 and 94, respectively. The output signal of comparator 92 is applied to one input of AND gate 80 and to inverter 96, where it is inverted and applied to one input of AND gate 98. The output signal of comparator 94 is applied to the other input of AND gate 98, and the output of AND gate 98 is applied to an input of AND gate 84. The other terminals of AND gates 80 and 84 receive the timing pulse from one-shot 78.

Similarly, the negative threshold range is provided by the resistor pair 100 and 102 between −Vref and system ground. The negative threshold voltages DT− and DDT− developed thereby are applied to the positive input terminals of comparators 104 and 106, respectively. The output signal of comparator 104 is applied to one input of AND gate 82 and to inverter 108, where it is inverted and applied to one input of AND gate 110. The output signal of comparator 102 is applied to the other input of AND gate 110, and the output of AND gate 110 is applied to an input of AND gate 86. The other terminals of AND gates 82 and 86 receive the timing pulse from one shot 78.

Turning to the operation of the modified peak detector 64, comparators 92 and 104 compare the first, upper (absolute value) threshold levels CT+ and DT− for a valid clock or data peak to the incoming read out signal pattern. Comparators 94 and 106 compare the second, lower (absolute value) threshold levels CDT+ and DDT− to the incoming read out signal pattern shown in FIG. 3A. At the same time, the timing pulse is developed from the differentiation and zero crossing detection of the peak magnitude of the read out signal pattern.

Turning for example to the operation of the PPD 70, when a positive, clock peak occurs that exceeds the first and second thresholds CT+ and CDT+ in magnitude, comparators 92 and 94 both go high at the point where their respective thresholds are exceeded,. The positive pulse output of comparator 92 and the timing pulse are simultaneously applied to AND gate 80, allowing the peak detect pulse PD+ to be transmitted to the decoder. The inverted pulse from inverter 96 disables AND gate 98 for the duration of the positive pulse output. Consequently, a pair of pulses may be passed by the AND gate 98 and applied to one input of AND gate 84 bracketing the timing pulse. Since the pulses do not overlap, the output of AND gate 84 does not go high and does not provide the drop-out pulse DO+. In this fashion, the decoding of the drop-out pulse DO+ is inhibited or negated when the peak magnitude of the read out signal pattern exceeds the first and second thresholds CT+ and CDT+ and the decoding of the valid peak detect pulse PD+ is allowed.

When a positive signal pattern peak magnitude occurs that exceeds only the lower positive threshold CDT+, comparator 94 applies its somewhat narrower high pulse output to AND gate 98 while the other input state is high, resulting in a high output applied to one input of AND gate 84 at the same time that the timing pulse is present at the other input. Therefore, the output of AND gate 84 goes high for the overlapping duration of the two pulses, resulting in the generation of the drop-out signal DO+ applied to the decoder.

Figure 3E:
Figure 3F:

The NPD 72 operates in a similar fashion to compare negative going data pulse signals to the third and fourth thresholds DT− and DDT− to develop either the PD− or DO− pulse signals of FIGS. 3E or 3F. Again, the timing pulse generated by one-shot 78 inhibits and negates the passage of drop-out pulse DO− through AND gate 86 when the magnitude of the negative, data peak exceeds the third threshold DT− and the peak detect pulse PD− is passed through gate 82.

It is critical that the second and fourth thresholds CDT+ and DDT− are set such that at least one positive or negative peak will fall in the positive or negative threshold range during either the onset or the end of a drop-out. This range will vary depending on the type of media and head used in the system.

The invention as described above is usable in any form of magnetic or optical recording or the like on any medium. Moreover, it may be used in any type of peak recording data coding other than the above described, NRZ or NRZI PPM code. A number of advantages flow as a result of being able to detect the onset of a drop-out and the recovery or drop-in peak. Frequently, drop-outs of just a few bits occur, typically because of a momentary loss of contact of the head with the magnetic media as described above. In a typical clocked code, the number of missing bits can be determined. Once the number of bits are determined, the location in the stream of bytes can be determined.

In certain data recording formats, the bytes of a data block are redundantly recorded, and the bytes located thereby having the drop-out bits can be ignored in favor of the back-up bytes. In other data recording formats, e.g. the format depicted above in Tables I and II, the corrupted data byte may be reconstituted from the LRC and the byte parity bits $P_1 \ldots P_n$.

From Table II above, it will be recalled that a drop-out of three information-cells and the respective data bits $d_{25}$, $d_{26}$, $d_{27}$, occurred in the second row, causing the data bytes and the LRC parity bits to shift in the recovered block. In accordance with one use of the invention, the DO+ or DO− code is maintained in a parallel register corresponding to the bit location $d_{24}$ and/or $d_{25}$. The Table II data stream may be shifted as shown in Table III until the column parity bits for the parity column and the data columns 1–4 are correct:

| Shifted Data | | | | | | | |
| --- | --- | --- | --- | --- | --- | --- | --- |
| $P_1$ | $d_{11}$ | $d_{12}$ | $d_{13}$ | $d_{14}$ | $d_{15}$ | $d_{16}$ | $d_{17}$ |
| $P_2$ | $d_{21}$ | $d_{22}$ | $d_{23}$ | $d_{24}$ | X | X | X |
| $P_3$ | $d_{31}$ | $d_{32}$ | $d_{33}$ | $d_{34}$ | $d_{35}$ | $d_{36}$ | $d_{37}$ |
| P | P | P | P | P | P | P | P |

Since the LRC parity bits for the three columns and the row parity bit $P_2$ are now known, and since the other data bits in columns 5, 6, 7 are also known, the missing data bits $d_{25}$, $d_{26}$, $d_{27}$, can be reconstituted from the unknown values X. One particular form of decoding of the data bits and drop-out bit locations is described further in the above-referenced '(Docket 70203WFN) application.

While there has been shown what are considered to be the preferred embodiments of the invention, it will be manifest that many changes and modifications may be made therein without departing from the essential spirit of the invention. It is intended, therefore, in the following claims to cover all such changes and modifications as may fall within the true scope of the invention.

PARTS LIST FOR FIGS. 1–4 read circuit 10
read/write magnetic head 12
lines 14, 26, 28
pre-amplifier 16
filter 18
post-amplifier 20
line 22, 34, 38, 44, 46, 48, 52, 54, 58, 60, 62, 64
peak detector 24 positive peak detector (PPD) 30
negative peak detector (NPD) 32
flip-flop 36
delay circuit 40
computer 42
up/down counter 50
system clock 56
modified peak detector 64
modified PPD 70
modified NPD 72
differentiator 74
comparator 76
bi-directional one-shot 78
AND gates 80, 82, 84, 86, 98, 110
positive threshold resistor pair 88 and 90
comparators 92, 94, 104,106
inverter 96
negative threshold resistor pair 100 and 102

I claim:

1. A method of locating drop-outs in the read out peak signal patterns of encoded data comprising the steps of:

providing a first threshold for decoding a peak of the read out signal pattern as a valid peak;

providing a second threshold lower in absolute magnitude than said first threshold indicative of a drop-out in the readout signal pattern magnitude;

comparing the read out signal pattern to the first and second thresholds;

decoding a valid peak detect pulse when a predetermined relationship between the magnitude of the read out signal pattern and the first threshold exists;

decoding a drop-out pulse when a predetermined relationship between the magnitude of the read out signal pattern and the second threshold exists; and inhibiting the decoding of the drop-out pulse when the predetermined relationship between the magnitude of the read out signal pattern and the first threshold exists.

2. The method of claim 1 further comprising the step of:

detecting the peaks of the read out signal pattern and providing a timing pulse in response thereto; and said inhibiting step further comprises the step of:

negating the decoding of the drop-out pulse in response to the timing pulse and the decoding of the valid peak detect pulse.

3. The method of claim 2 wherein said encoded data comprises magnetically recorded signal patterns having successive positive and negative peaks signifying information content by relative position of the peaks.

4. The method of claim 1 wherein said encoded data comprises magnetically recorded signal patterns having successive positive and negative peaks signifying information content by relative position of the peaks.

5. Apparatus for locating recording drop-outs in the read out peak signal patterns of encoded data comprising:

means for providing a first threshold for decoding a peak of the read out signal pattern as a valid peak;

means for providing a second threshold lower in absolute magnitude than said first threshold indicative of a drop-out in the readout signal pattern magnitude;

means for comparing the read out signal pattern to the first and second thresholds;

means for decoding a valid peak detect pulse when a predetermined relationship between the magnitude of the read out signal pattern and the first threshold exists;

means for decoding a drop-out pulse when a predetermined relationship between the magnitude of the read out signal pattern and the second threshold exists; and means for inhibiting the decoding of the drop-out pulse when the predetermined relationship between the magnitude of the read out signal pattern and the first threshold exists.

6. The apparatus of claim 5 further comprising:

means for detecting the peaks of the read out signal pattern and providing a timing pulse in response thereto; and said inhibiting means further comprises:

means for negating the decoding of the drop-out pulse in response to the timing pulse and the decoding of the valid peak detect pulse.

7. The apparatus of claim 6 wherein said encoded data comprises magnetically recorded signal patterns having successive positive and negative peaks signifying information content by relative position of the peaks.

8. The apparatus of claim 5 wherein said encoded data comprises magnetically recorded signal patterns having successive positive and negative peaks signifying information content by relative position of the peaks.

9. A method of locating drop-outs in recorded analog signal patterns having successive positive and negative peaks signifying information content comprising the steps of:

reading out the recorded signal patterns varying in magnitude to derive positive and negative peak signals of the analog signal patterns;

providing positive and negative valid peak detect thresholds for decoding the peaks of the read out signal pattern as valid peaks;

providing positive and negative drop-out thresholds lower in absolute magnitudes than said respective positive and negative valid peak detect thresholds indicative of a drop-out in the recorded signal pattern magnitude;

comparing the read out signal pattern to the positive and negative valid peak detect thresholds and the drop-out thresholds;

decoding a positive or negative valid peak detect pulse when a predetermined relationship between the peak magnitude of the read out signal pattern and the positive or negative peak detect threshold exists;

decoding a drop-out pulse when a predetermined relationship between the peak magnitude of the read out signal pattern and the positive or negative drop-out thresholds exists; and wherein the recorded signal pattern is a self-clocking signal pattern with clock pulses coded as one of the positive or negative valid peak magnitudes exceeding said positive or negative peak detect threshold and data pulses coded as the other of the positive or negative valid peak magnitudes pulses exceeding said positive or negative peak detect threshold.

10. The method of claim 9 wherein said decoding steps further comprise the steps of:

comparing the positive peak magnitude to the positive peak detect threshold and decoding a clock pulse when a predetermined relationship between the positive peak magnitude and the positive peak detect threshold exists;

comparing the negative peak magnitude to the negative peak detect threshold and decoding a data pulse when a predetermined relationship between the negative peak magnitude and the negative peak detect threshold exists;

comparing the positive peak magnitude to the positive drop-out threshold and decoding a positive drop-out pulse when a predetermined relationship between the positive peak magnitude and the negative drop-out threshold exists; and comparing the negative peak magnitude to the negative drop-out threshold and decoding a negative drop-out pulse when a predetermined relationship between the negative peak magnitude and the negative drop-out threshold exists.

11. The method of claim 9 further comprising the step of:

inhibiting the decoding of the drop-out pulse when the predetermined relationship between the peak magnitude of the read out signal pattern and the positive or negative peak detect threshold exists.

12. The method of claim 11 further comprising the step of:

detecting the peaks of the read out signal pattern and providing a timing pulse in response thereto; and said inhibiting step further comprises the step of:

negating the decoding of the drop-out pulse in response to the timing pulse and the decoding of the valid peak detect pulse.

13. Apparatus for locating drop-outs in read out analog signal patterns having successive positive and negative peaks signifying information content comprising:

means for providing positive and negative valid peak detect thresholds for decoding the peaks of the read out signal pattern as valid peaks;

means for providing positive and negative drop-out thresholds lower in absolute magnitudes than said respective positive and negative valid peak detect thresholds indicative of a drop-out in the readout signal pattern magnitude;

means for comparing the read out signal pattern to the positive and negative valid peak detect thresholds and the drop-out thresholds;

means for decoding a positive or negative valid peak detect pulse when a predetermined relationship between the magnitude of the read out signal pattern and the positive or negative peak detect threshold exists;

means for decoding a drop-out pulse when a predetermined relationship between the magnitude of the read out signal pattern and the positive or negative drop-out thresholds exists; and wherein the readout signal pattern is a self-clocking signal pattern with clock pulses coded as one of the positive or negative valid peak magnitudes exceeding said positive or negative peak detect threshold and data pulses coded as the other of the positive or negative valid peak magnitudes pulses exceeding said positive or negative peak detect threshold.

14. The apparatus of claim 13 wherein said decoding means further comprise:

means for comparing the positive peak magnitude to the positive peak detect threshold and decoding a clock pulse when a predetermined relationship between the positive peak magnitude and the positive peak detect threshold exists;

means for comparing the negative peak magnitude to the negative peak detect threshold and decoding a data pulse when a predetermined relationship between the negative peak magnitude and the negative peak detect threshold exists;

means for comparing the positive peak magnitude to the positive drop-out threshold and decoding a positive dropout pulse when a predetermined relationship between the positive peak magnitude and the positive drop-out threshold exists; and means for comparing the negative peak magnitude to the negative drop-out threshold and decoding a negative drop-out pulse when a predetermined relationship between the negative peak magnitude and the negative drop-out threshold exists.

15. The apparatus of claim 13 further comprising:

means for inhibiting the decoding of the drop-out pulse when the predetermined relationship between the peak magnitude of the read out signal pattern and the positive or negative peak detect threshold exists.

16. The apparatus of claim 15 further comprising:

means for detecting the peaks of the read out signal pattern and providing a timing pulse in response thereto; and said inhibiting means further comprises:

means for negating the decoding of the drop-out pulse in response to the timing pulse and the decoding of the valid peak detect pulse.

* * * * *